(12) United States Patent
Park

(10) Patent No.: US 7,148,721 B2
(45) Date of Patent: Dec. 12, 2006

(54) SEMICONDUCTOR INTEGRATED CIRCUIT DEVICE CAPABLE OF CONTROLLING IMPEDANCE

(75) Inventor: Youn-Sik Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 61 days.

(21) Appl. No.: 10/912,942

(22) Filed: Aug. 5, 2004

(65) Prior Publication Data
US 2005/0040845 A1    Feb. 24, 2005

(30) Foreign Application Priority Data
Aug. 19, 2003   (KR) .................... 10-2003-0057245

(51) Int. Cl.
*H03K 19/003* (2006.01)
(52) U.S. Cl. .......................................... 326/30; 326/26
(58) Field of Classification Search .................. 326/30
See application file for complete search history.

(56) References Cited

U.S. PATENT DOCUMENTS

| 5,666,078 | A | 9/1997 | Lamphier et al. |
| 5,995,894 | A | 11/1999 | Wendte |
| 6,157,206 | A | 12/2000 | Taylor et al. |
| 6,815,979 | B1 * | 11/2004 | Ooshita ................. 326/30 |
| 6,836,143 | B1 * | 12/2004 | Song .................... 326/30 |
| 2005/0012533 | A1 * | 1/2005 | Aoyama et al. ........ 327/170 |

FOREIGN PATENT DOCUMENTS

KR      10-332455      4/2002

OTHER PUBLICATIONS

English language Abstract of Korean Patent Publication No. 10-332455, May 3, 2001.

* cited by examiner

*Primary Examiner*—James H. Cho
(74) *Attorney, Agent, or Firm*—Marger Johnson & McCollom, P.C.

(57) ABSTRACT

A semiconductor integrated circuit device is connected to an external reference resistor, including an impedance control circuit for generating impedance control codes variable with impedances established by the external reference resistor. An input circuit receives an external signal through an input transfer line and forwards the external signal to an internal circuit. A termination circuit terminates the input transfer line in response to at least one of the impedance control code. An output circuit drives an output transfer line in accordance with an output signal. Impedance is variable with the control codes.

36 Claims, 14 Drawing Sheets

SEMICONDUCTOR INTEGRATED CIRCUIT DEVICE CAPABLE OF CONTROLLING IMPEDANCE

CROSS REFERENCE TO RELATED APPLICATIONS

This application claims priority from Korean Patent Application No. 2003-57245, filed on Aug. 19, 2003, the contents of which are incorporated herein by reference in their entirety.

BACKGROUND OF THE INVENTION

1. Field of this Invention

This disclosure relates to a semiconductor integrated circuit device, and more particularly, to a semiconductor integrated circuit device including circuits for programmable bus termination and impedance driving.

2. Description of Related Art

In designing high frequency integrated circuit devices associated with a double data rate (DDR) memory, it is becoming important with input/output AC characteristics of data, address, and control signals in accordance with the advancement of functionality in semiconductor device industries. The AC characteristics are more affected from the property of channels linking two or more numbers of devices, rather than from integrated circuit devices or controllers for managing the devices. Thus, it is essential to regard the channel characteristics in designing the high frequency integrated circuit devices.

There have been various studies to improve the channel characteristics, such as techniques using programmable circuits for on-die termination and off-chip driving. Several disclosures about the circuits of on-die termination and off-chip driving are proposed in U.S. Pat. No. 5,666,078 entitled "Programmable impedance output driver", U.S. Pat. No. 5,995,894 entitled "method for controlling the impedance of a driver circuit", U.S. Pat. No. 6,157,206, and Korean Patent No. 10-0332455.

As well known persons skilled in this art, the impedances of the on-die termination circuit and the off-chip driver are adjusted different from each other. For instance, an impedance of the on-die termination circuit is established to 60Ω while that of the off-chip driver is set to 40Ω. The preceding arts usually employ additional control circuits and external reference resistors to control the impedance of the on-die termination and off-chip driving circuits.

However, those techniques enlarge chip sizes and the number of pins to increase the burden of designing semiconductor integrated circuit devices.

SUMMARY OF THE INVENTION

The present invention provides a semiconductor integrated circuit device being comprised of efficient circuit features for impedance control of termination and off-chip driving circuits with a single reference resistor.

In an exemplary embodiment of the invention, a semiconductor integrated circuit device comprises an impedance controller, an input circuit, an output circuit, and a termination circuit. The impedance controller generates impedance control codes variable in accordance with an impedance of an external reference resistor. The input circuit for transferring an input signal to an internal circuit, the input signal being supplied through an input signal transfer line. The termination circuit for terminating the input signal transfer line in response to at least one of the impedance control codes. The output circuit for driving an output signal transfer line in accordance with a signal output from the internal circuit, having an impedance variable in accordance with the impedance control codes.

In this embodiment, the termination circuit comprises a multiplicity of termination blocks connected in parallel to the input signal transfer line, each termination block being controlled by one of the impedance control codes. Otherwise, the termination circuit comprises a multiplicity of termination blocks connected in parallel to the input signal transfer line, each termination block being controlled by the impedance control codes. The output circuit comprises a multiplicity of drivers connected in parallel to the output signal transfer line, each driver having an impedance adjustable by the impedance control codes.

In this embodiment, the impedance controller comprises: a pad connected to the external reference resistor; a first variable impedance circuit connected to the pad, being controlled by a first impedance control code among the impedance control codes for impedance match with the external reference resistor; a first comparator for comparing a voltage of the pad with a reference voltage; a first up/down counter for generating the first impedance control code in response to an output of the first comparator; a second variable impedance circuit connected to an internal node, being controlled by the first impedance control code among the impedance control codes for impedance match with the external reference resistor; a third variable impedance circuit connected to the internal node, being controlled by a second impedance control code among the impedance control codes for impedance match with the external reference resistor; a second comparator for comparing a voltage of the internal node with the voltage of the pad; and a second up/down counter for generating the second impedance control code in response to an output of the second comparator.

In another feature of the present invention, a semiconductor memory device comprises: an array of memory cells arranged in rows and columns; a sense amplifier circuit for reading/writing data from/in the memory cells; a first code generator for generating fixed impedance control codes; a second code generator for generating variable impedance control codes dependent on an impedance of the external reference resistor; a selector for selecting the fixed impedance control codes or the variable impedance control codes in response to a code selection signal; a drive controller for generating pull-up and pull-down control signals in response to data output from the sense amplifier circuit and the fixed or variable impedance control codes selected by the selector; an off-chip driver for driving data transfer lines in response to the pull-up and pull-down control signals during a read operation, having an impedance variable in accordance with the pull-up and pull-down control signals; and a first termination circuit for terminating the data transfer lines in response to at least the alternative of the fixed and variable impedance control codes selected by the selector during a write operation.

In this embodiment, further may be comprised of: an input buffer for receiving address and control signals input through input transfer lines; a row decoder for selecting the row in response to a row address output from the input buffer; a column decoder for selecting the column in response to a column address output from the input buffer; and a second termination circuit for terminating the input transfer lines in response to at least the alternative of the fixed and variable impedance control codes selected by the selector.

In this embodiment, the second code generator comprises: a pad connected to the external reference resistor; a first variable impedance circuit connected to the pad, being controlled by a first impedance control code among the impedance control codes for impedance match with the external reference resistor; a first comparator for comparing a voltage of the pad with a reference voltage; a first up/down counter for generating the first impedance control code in response to an output of the first comparator; a second variable impedance circuit connected to an internal node, being controlled by the first impedance control code among the impedance control codes for impedance match with the external reference resistor; a third variable impedance circuit connected to the internal node, being controlled by a second impedance control code among the impedance control codes for impedance match with the external reference resistor; a second comparator for comparing a voltage of the internal node with the voltage of the pad; and a second up/down counter for generating the second impedance control code in response to an output of the second comparator.

In another feature of the present invention, a semiconductor integrated circuit device comprises: an input circuit for transferring an external signal from an input signal transfer line to an internal circuit; an impedance controller for generating impedance control codes variable in accordance with an external reference resistor, including binary-weighted transistors and binary-weighted resistors; a termination circuit for terminating the input signal transfer line in response to at least one of the impedance control codes, including binary-weighted transistors and binary-weighted resistors; and an output circuit for driving an output signal transfer line in accordance with a signal output from the internal circuit, including binary-weighted transistors and binary-weighted resistors and having an impedance variable in accordance with the impedance control codes; wherein the binary-weighted transistors and resistors, of the termination circuit and the output circuit, are configured with linearly shrunk down from the binary-weighted transistors and resistors of the impedance controller.

In another feature of the present invention, a semiconductor memory device is comprised of: an array of memory cells arranged in rows and columns; a sense amplifier circuit for reading/writing data from/in the memory cells; a first code generator for generating fixed impedance control codes; a second code generator for generating variable impedance control codes dependent on an impedance of the external reference resistor, including binary-weighted transistors and binary-weighted resistors; a selector for selecting the fixed impedance control codes or the variable impedance control codes in response to a code selection signal; a drive controller for generating pull-up and pull-down control signals in response to data output from the sense amplifier circuit and the fixed or variable impedance control codes selected by the selector; an off-chip driver for driving data transfer lines in response to the pull-up and pull-down control signals during a read operation, having an impedance variable in accordance with the pull-up and pull-down control signals and including binary-weighted transistors and binary-weighted resistors; and a first termination circuit for terminating the data transfer lines in response to at least the alternative of the fixed and variable impedance control codes selected by the selector during a write operation, including binary-weighted transistors and binary-weighted resistors. The binary-weighted transistors and resistors, of the first termination circuit and the off-chip driver, are configured with linearly shrunk down from the binary-weighted transistors and resistors of the second code generator.

In this embodiment, further may be comprised of: an input buffer for receiving address and control signals input through input transfer lines; a row decoder for selecting the row in response to a row address output from the input buffer; a column decoder for selecting the column in response to a column address output from the input buffer; and a second termination circuit for terminating the input transfer lines in response to at least the alternative of the fixed and variable impedance control codes selected by the selector, including binary-weighted transistors and binary-weighted resistors.

In still another feature of the present invention, a semiconductor memory device comprises: an array of memory cells arranged in rows and columns; a sense amplifier circuit for reading/writing data from/in the memory cells; a code generator for generating impedance control codes variable in accordance with an impedance of the external reference resistor; a drive controller for generating pull-up and pull-down control signals in response to data output from the sense amplifier circuit and the impedance control codes selected by the selector; an off-chip driver for driving data transfer lines in response to the pull-up and pull-down control signals during a read operation, having an impedance variable in accordance with the pull-up and pull-down control signals; and a first termination circuit for terminating the data transfer lines in response to at least one of the impedance control codes during a write operation.

DETAILED DESCRIPTION OF THE PREFERRED EMBODIMENT

Figure 1:
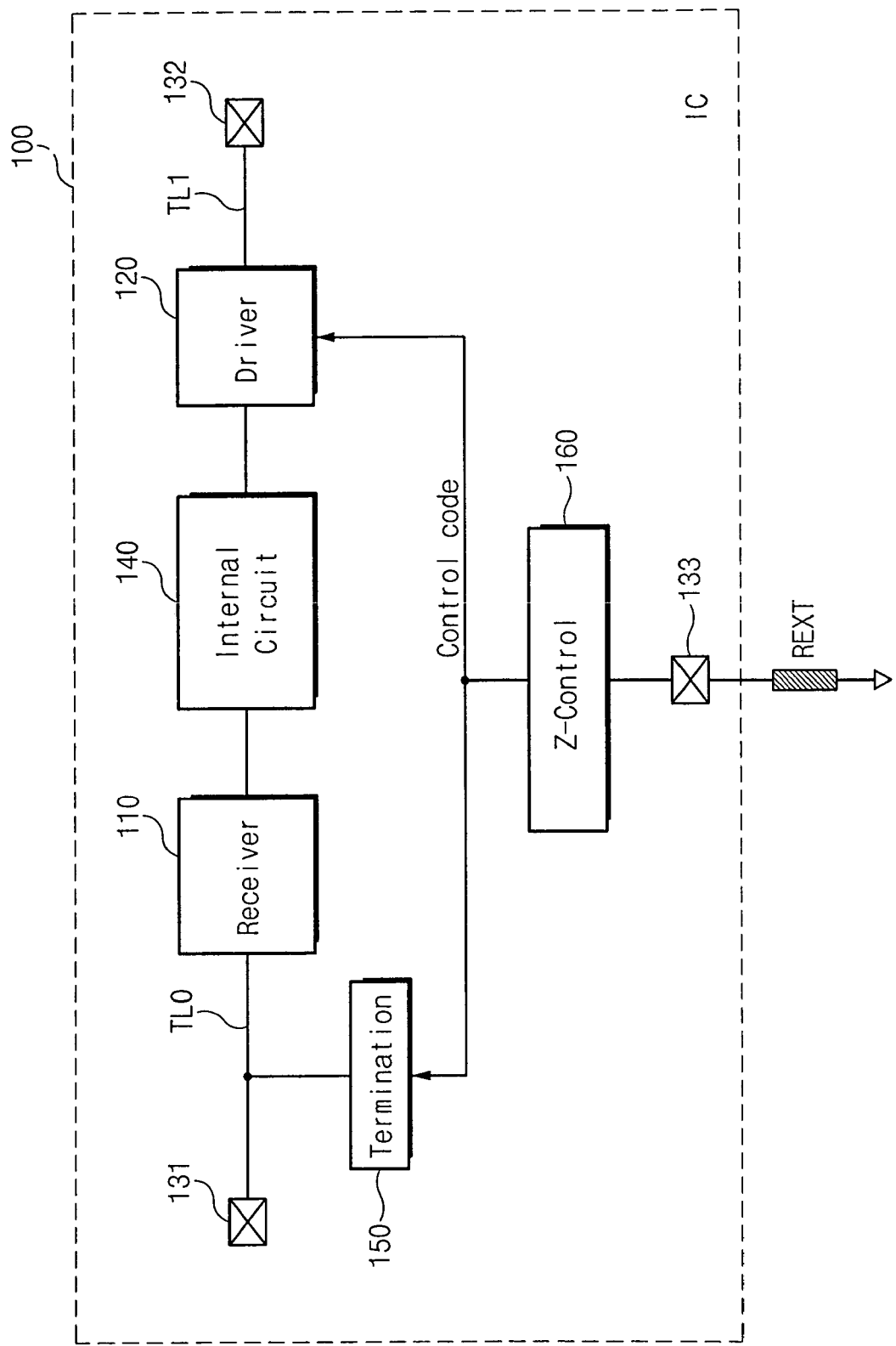
FIG. 1 is a block diagram of a semiconductor memory device according to the present invention.

With reference now to the drawings wherein like or similar elements are designated with identical reference numerals throughout the several views and wherein various elements depicted are not necessarily drawn to scale.

FIG. 1 is a block diagram of a semiconductor memory device according to the present invention. Referring to FIG. 1, the semiconductor integrated circuit device 100 is constructed to communicate other integrated circuit devices, including a receiver 110 and a driver 120. The receiver 110 is connected to a pad 131 through a signal transfer line TL0 to receive external signals (e.g., control signals or address signals) through the pad 131. The driver 120 is connected to a pad 132 through a signal transfer line TL1. The driver 120 operates the signal transfer line TL1 in response to internal signals (e.g., data signals).

To the signal transfer line TL0, a termination circuit 150 is connected. The pad 131 may be connected to other integrated circuit device through an external transfer line. The termination circuit 150 is provided to terminate the signal transfer line TL0 to reduce signal reflections due to impedance (Z) mismatches between the external transfer line (not shown) and the receiver 110. The impedance controller 160 is connected to a pad 133 to which an external reference resistor REXT is connected, and generates a control code variable in accordance with an impedance of the external reference resistor REXT. The termination circuit 150 and the driver 120 are operable with variable impedances in contemporaneously response to the control code supplied from the impedance controller 160. In other words, the impedance controller 160 variably adjusts the impedance of the termination circuit 150 in variable options, the driver 120 as well, in accordance with the impedance established by the reference resistor 160.

The variable impedance control scheme may be properly applicable to high bandwidth semiconductor memory devices as typical integrated circuit chips, as well as adaptable to other kinds of semiconductor integrated circuit devices operable in high frequencies.

Figure 2:
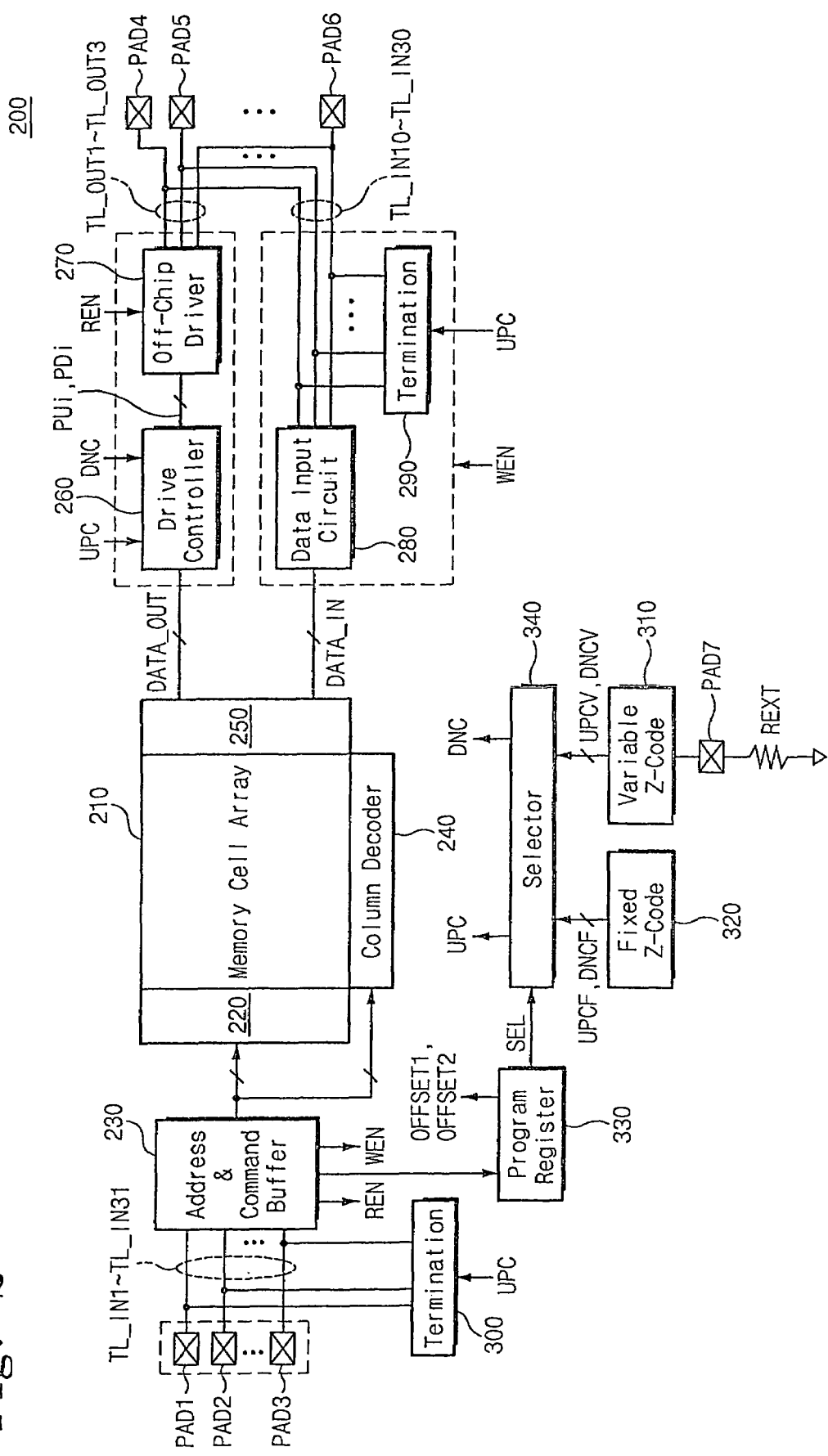
FIG. 2 is a block diagram of a semiconductor memory device according to the present invention.

FIG. 2 illustrates a semiconductor memory device practically employing the variable impedance control function therein according to the present invention. The semiconductor memory device is operable in a high bandwidth (or frequency) condition and sensitive to channel peculiarities, such as a dual data rate (DDR) memory or more high frequency memory.

Referring to FIG. 2, the memory device 200 includes a memory cell array 210 in which a plurality of memory cells are arranged in a matrix of rows (or wordlines) and columns (or bitlines). In the memory device 200, a row decoder 220 selects the rows in response to row addresses provided from an address/command buffer 230. A column decoder 240 selects the columns in response to column addresses provided from the address/command buffer 230. A sense amplifier circuit 250 keeps data to be read out from or written into the memory cell array 210 in sufficient voltage levels.

A drive controller 260 receives data from the sense amplifier circuit 250 and generates pull-up and pull-down control signals, PUi and PDi, in response to impedance control codes UPC and DNC. Here, the code UPC is used to increase the impedance while the code DNC is used to decrease the impedance. An off-chip driver 270 enables output transfer lines TL_OUT1~TL_OUT3 in response to the pull-up and down control signals, PUi and PDi, supplied from the drive controller 260. The output transfer lines TL_OUT1~TL_OUT3 are connected to their corresponding pads PAD4~PAD6, respectively. An impedance of the off-chip driver 270 is variable in accordance with selective activations of the pull-up and down control signals PUi and PDi, which will be more described later. The data input circuit 280 is connected to the pads PAD4~PAD6 through input transfer lines TL_IN10~TL_IN30 to transfer data of the pads PAD4~PAD6 to the sense amplifier circuit 250. To the input transfer lines TL_IN10~TL_IN30, a termination circuit 290 is coupled. The termination circuit 290 is operable by responding to the impedance control code UPC or to both the codes UPC and DNC, terminating the input transfer lines TL_IN10~TL_IN30 to reduce signal reflections due to impedance mismatches between an external transfer line (not shown) and the data input circuit (corresponding to the receiver 110 of FIG. 3).

In this embodiment, the drive controller 260 and the off-chip driver 270 are conductive during an activation of a control signal REN (i.e., a read enable signal) relevant to a read operation, while the data input circuit 280 and the termination circuit 290 is conductive during an activation of a control signal WEN (i.e., a write enable signal) relevant to a write operation.

Continuous to FIG. 2, the address/command buffer 230 is connected to pads PAD1~PAD3 through input transfer lines TL_IN1~TL_IN31 to receive address and command signals from the external (e.g., a memory controller) in pre-designed timings. Row addresses among the input addresses are transferred to the row decoder 220 and column addresses are transferred to the column decoder 240. To the input transfer lines, a termination circuit 300 is coupled. The termination circuit 300 is operable by responding to the impedance control code UPC or to both the codes UPC and DNC, terminating the input transfer lines TL_IN10~TL_IN30 to reduce signal reflections due to impedance mismatches between an external transfer line (not shown) and the address/command buffer 230 (corresponding to the receiver 110 of FIG. 3).

As illustrated in FIG. 2, a pad PAD7 is coupled to an external reference resistor REXT and a variable impedance code generator 310. The variable impedance code generator 310 creates impedance control codes UPCV and DNCV variable in accordance with an impedance of the external reference resistor REXT. But, a fixed Impedance code generator 320 creates impedance control codes UPCF and DNCF fixed regardless of the impedance of the external reference resistor REXT. The generation of the variable and fixed impedance control codes will be more described later. A program register 330 is formed to be programmable by commands provided from the external, generating a code selection signal SEL and offset selection signals OFFSET1 and OFFSET2. For instance, the program register 330 may be implemented by the circuital methodology of mode register set, which is well known by a person skilled in the art. A selection circuit 340 designates the control codes UPC and DNC from the variable impedance control codes UPCV and DNCV supplied by the generator 310, or from the fixed impedance control codes UPCF and UPCF supplied by the code generator 320, in response to the code selection signal SEL. The selected control codes UPC and DNC are applied to the drive controller 260 and the termination circuits 290 and 300.

From the described above, it is noticeable that the impedances of the termination circuits 290 and 300 are variable by the control codes UPC and DNC, the impedance of the off-chip driver 270 as well. It means a single external reference resistor (i.e., RWXT) and impedance code generator (i.e., 310) is enough to control the impedances of the off-chip driver 270 and the termination circuits 290 and 300 in a contemporaneous mode.

Figure 3:
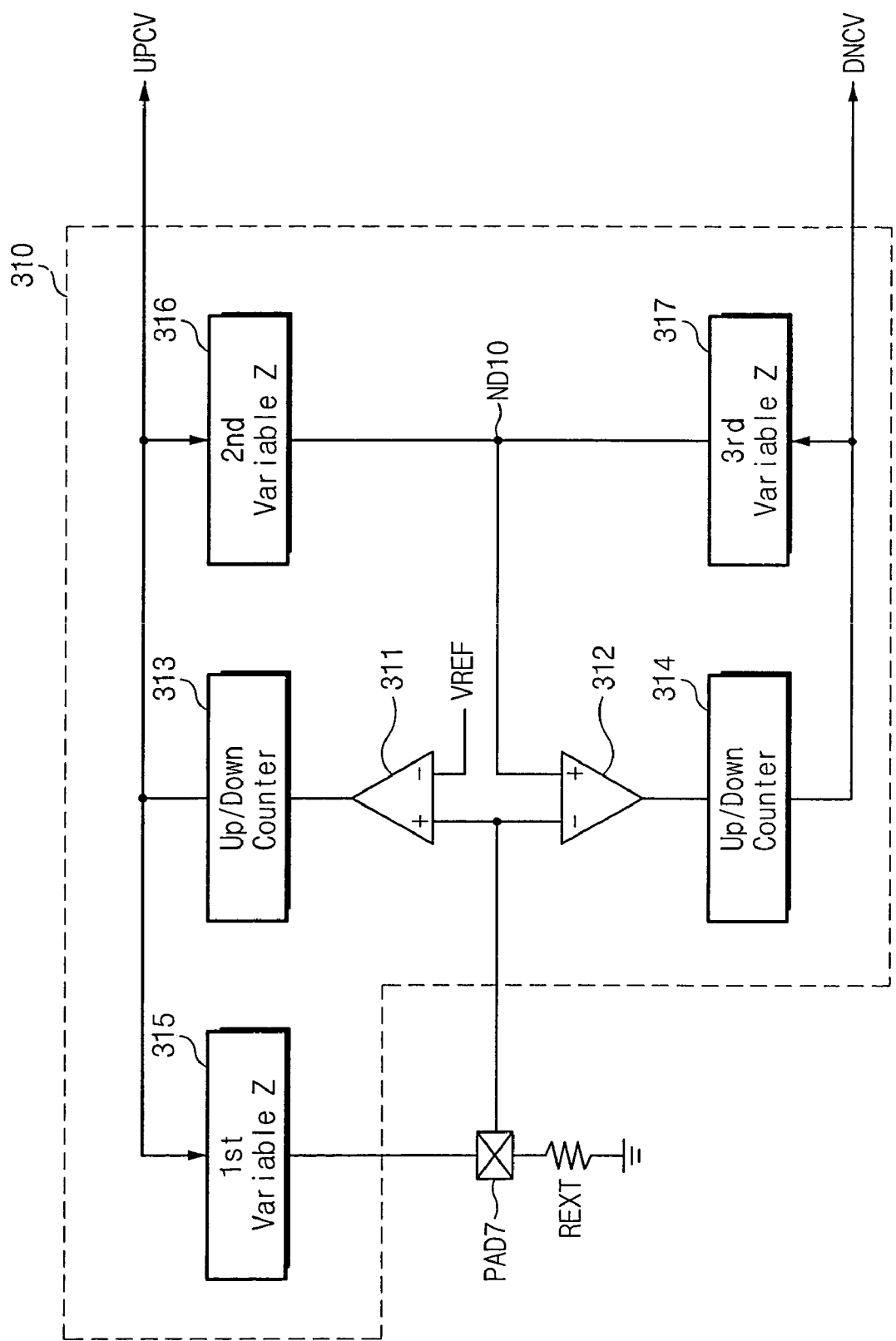
FIG. 3 is a block diagram of a variable impedance code generator shown in FIG. 2, according to a preferred embodiment of the present invention.

FIG. 3 illustrates a preferred functional structure of the variable impedance code generator shown in FIG. 2. Referring to FIG. 3, the variable impedance coder generator 310 is comprised of first and second comparators 311 and 312, first and second counters 313 and 314, and variable impedance circuits 315, 316, and 317.

The first comparator 311 detects whether or not a voltage of the pad PAD7 is higher than a predetermined reference voltage VREF (e.g., VDDQ/2). The first counter 313 generates a variable impedance control code UPCV in response to an output of the first comparator 311. Impedances of the variable impedance circuits 315 and 316 are dependent on the value of the variable impedance control code UPCV. Those operations will be reiterated until the voltage of the pad PAD7 reaches the reference voltage VREF. During this, the second comparator 312 detects whether or not a voltage of an internal node ND10 is higher than the voltage of the pad PAD7. The second counter 314 generates a variable impedance control code DNCV in response to an output of the second comparator 312. Impedances of the third variable impedance circuits 317 are dependent on the value of the variable impedance control code DNCV. Those operations will be reiterated also until the voltage of the internal node pad ND10 reaches the voltage of the pad PAD7.

For instance, assuming that the external reference resistor REXT is established with 24Ω, the variable impedance circuits 315~317 are controlled to have their impedances of 24Ωby way of the operations of the comparators and counters, 311~314.

In this embodiment, the first and second counters 313 and 314 are constructed of 7-bit up/down counters, so that the variable impedance control codes UPCV and DNCV are each composed of seven bits. But, those code formations may be changeable by the implemental capacities in the device.

Figure 4A:
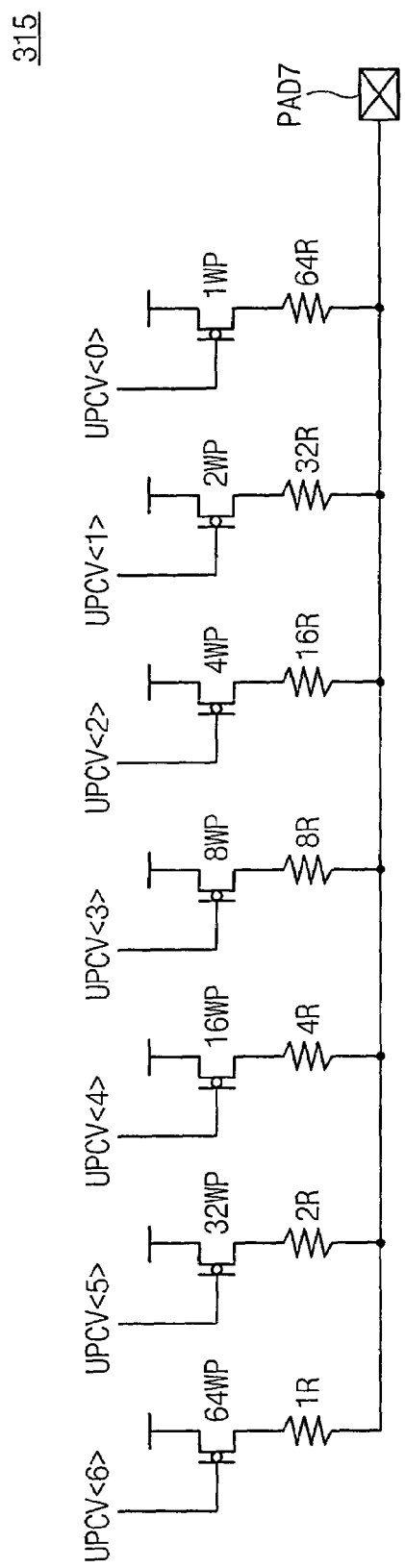
FIGS. 4A and 4B illustrates exemplary circuits of the variable impedance generator shown in FIG. 3.
Figure 4B:
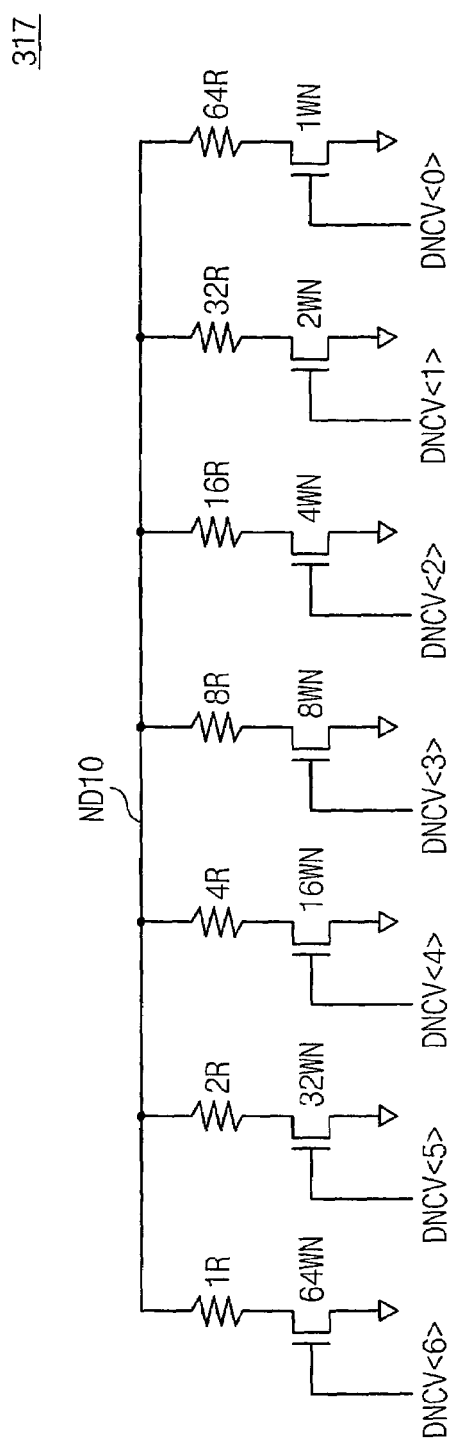

FIGS. 4A and 4B illustrates exemplary circuits of the variable impedance generator shown in FIG. 3. First, the variable impedance circuit 315 of FIG. 4A is formed of pairs of PMOS transistors (64WP, 32WP, 16WP, . . . , 2WP, and 1WP; 64WP~1WP) and resistors (1R, 2R, 4R, . . . , and 64R; 1R~64R), each corresponding to a multiplicity of the variable impedance control codes UPCV<6>~UPCV<0>. In each pair, the PMOS transistor and the resistor are connected between a power supply voltage and the pad PAD7 in series. The PMOS transistors 64WP~1WP of the variable impedance circuit 315 are binary-weighted transistors and the resistors 1R 64R of the variable impedance circuit 315 are binary-weighted resistors. The binary-weighted transistors 64WP~1WP are selective turned on in accordance with an alternative activation of the variable impedance control codes UPCV<6>~UPCV<0>, so that the variable impedance circuit 315 is adjusted to have the impedance as same as the external reference resistor REXT. Although not illustrated in the drawings, the second variable impedance circuit 316 is constructed as shown in FIG. 4A.

The third variable impedance circuit 317 of FIG. 4B is formed of pairs of NMOS transistors (64WN, 32WN, 16WN, . . . , 2WN, and 1WN; 64N~1WN) and resistors (1R, 2R, 4R, . . . , and 64R; 1R~64R), each corresponding to a multiplicity of the variable impedance control codes DNCV<6>~DNCV<0>. In each pair, the NMOS transistor and the resistor are connected between the internal node ND10 and a ground voltage (or substrate voltage) in series. The NMOS transistors 64WN~1WN of the variable impedance circuit 317 are binary-weighted transistors and the resistors 1R~64R of the variable impedance circuit 317 are binary-weighted resistors. The binary-weighted transistors 64WN~1WN are selective turned on in accordance with an alternative activation of the variable impedance control codes DNCV<6>~DNCV<0>, so that the variable impedance circuit 315 is adjusted to have the impedance as same as the external reference resistor REXT.

Figure 5:
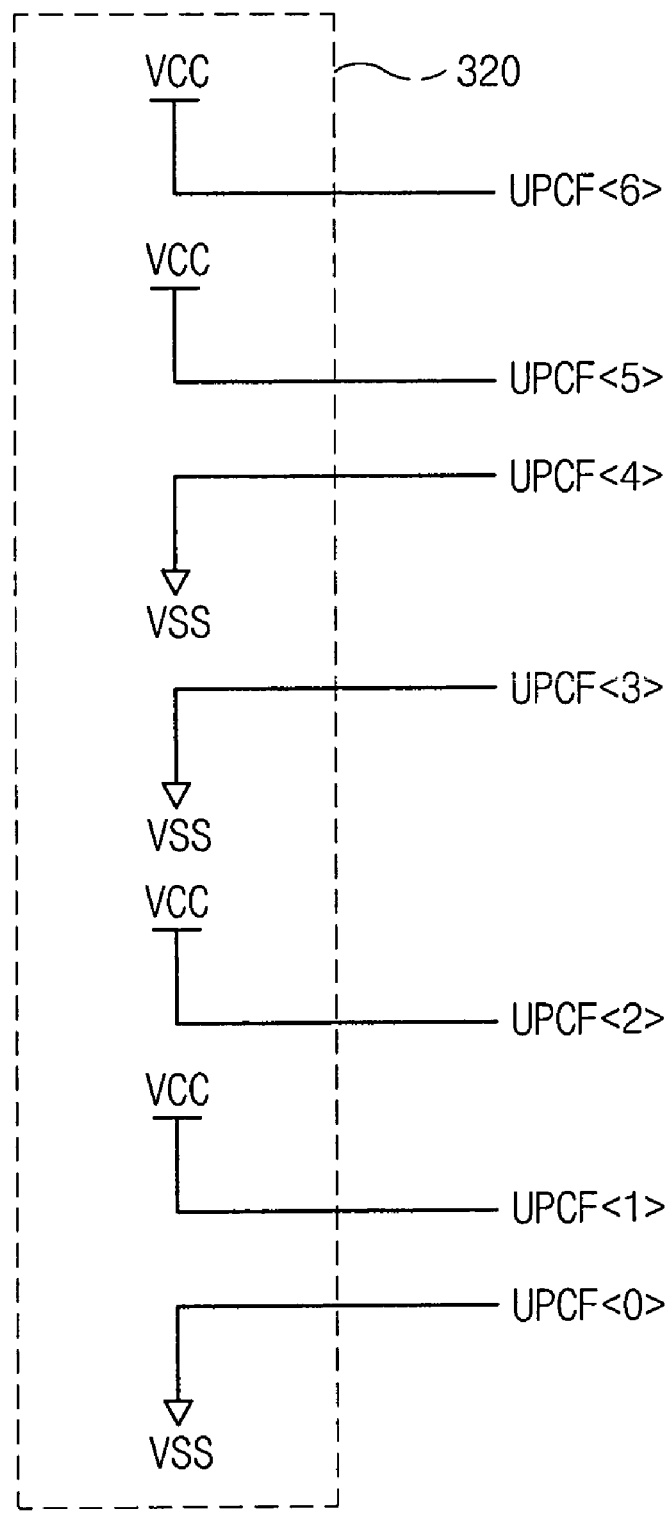
FIG. 5 illustrates an exemplary circuit of a fixed impedance code generator shown in FIG. 2.

FIG. 5 illustrates an exemplary circuit of the fixed impedance code generator 320 shown in FIG. 2.

Referring FIG. 5, the fixed impedance code generator 320 is configured to connect the fixed impedance control codes UPCF<0>~UPCF<6> to the power supply voltage of the ground voltage in accordance with predetermined values. Although not shown, the fixed impedance code generator 320 could be designed to set the fixed impedance control codes to be programmed by external data. Thus, the fixed impedance control codes UPCF can be generated by the connecting option as shown in FIG. 5 or the programming option. In addition, the fixed impedance control codes UPCF can be utilized as their counterpart impedance control codes DNCF.

Figure 6:
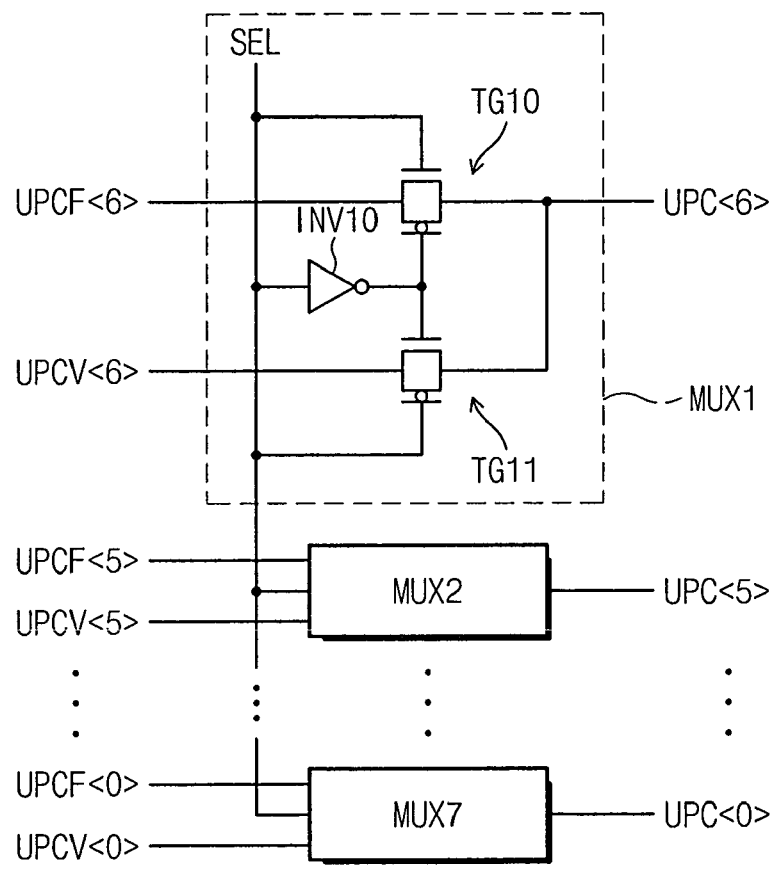
FIG. 6 illustrates an exemplary circuit of a selector shown in FIG. 2.
Figure 6:
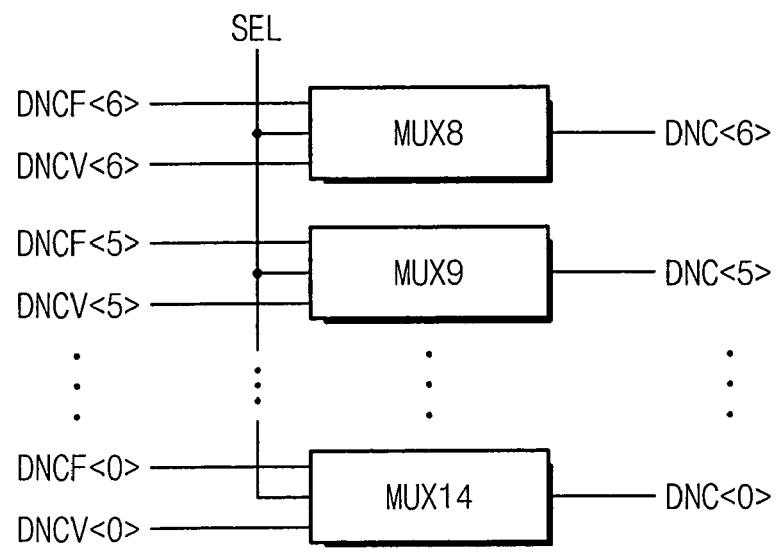

FIG. 6 illustrates an exemplary circuit of the selector 340 shown in FIG. 2, according to the present invention.

Referring to FIG. 6, the selector 340 is composed of a plurality of 2:1 multiplexers, e.g., fourteen multiplexers MUX1~MUX14. Each multiplexer is formed of an inverter INV10 and transmission gate TG10 and TG11, as illustrated in the block of MUX1. The other multiplexers MUX2~MUX14 are constructed with the same structure as MUX1. Each multiplexer receives a pair of the variable and fixed impedance control codes, correspondently assigned thereto, and outputs the impedance control code selected from them. A first group of the multiplexers, MUX1~MUX7, is used to set the impedance control codes UPC<6:0> in response to the variable and fixed impedance control codes UPCV<6:0> and UPCV<6:0>. A second group of the multiplexers, MUX8~MUX14, is used to set the impedance control codes DNC<6:0> in response to the variable and fixed impedance control codes DNCV<6:0> and DNCV<6:0>. Representatively, in the first group of the multiplexers, the multiplexer MUX1 receives the variable impedance control code UPCV<6>, provided from the variable impedance code generator 310, and the fixed impedance control code UPCF<6>, provided from the fixed impedance code generator 320, and then outputs the impedance control code UPC<6> by selecting one of the codes UPCV<6> and UPCF<6>. As the same manner, in the second group of the multiplexers, the multiplexer MUX8 receives the variable impedance control code DNCV<6>, provided from the variable impedance code generator 310, and the fixed impedance control code DNCF<6>, provided from the fixed impedance code generator 320, and then outputs the impedance control code DNC<6> by selecting one of the codes DNCV<6> and DNCF<6>.

When the code selection signal SEL is a low level, the selector 340 enables the variable impedance control codes UPCV<6:0> and DNCV<6:0> as the output codes UPC<6:0> and DNC<6:0> respectively. When the code selection signal SEL is a high level, the selector 340 enables the fixed impedance control codes UPCF<6:0> and DNCF<6:0> as the output codes UPC<6:0> and DNC<6:0> respectively FIG. 7 illustrates an exemplary circuit of the drive controller 260 shown in FIG. 2.

Figure 7:
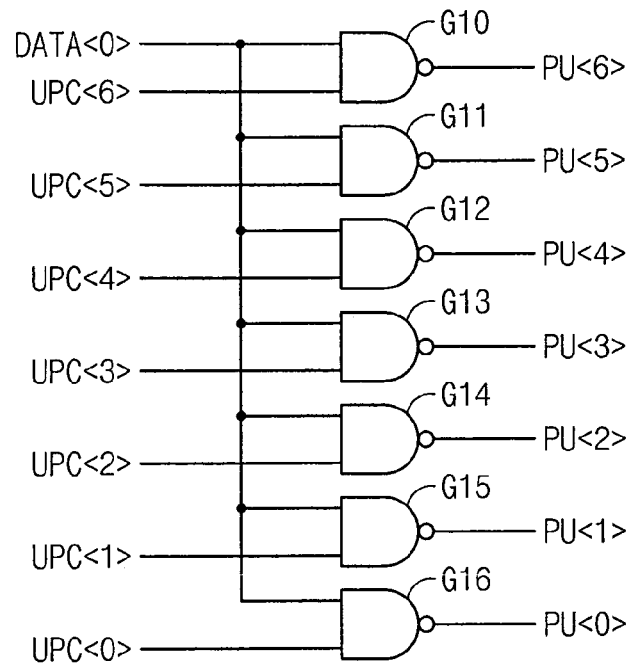
FIG. 7 illustrates an exemplary circuit of a drive controller shown in FIG. 2.
Figure 7:
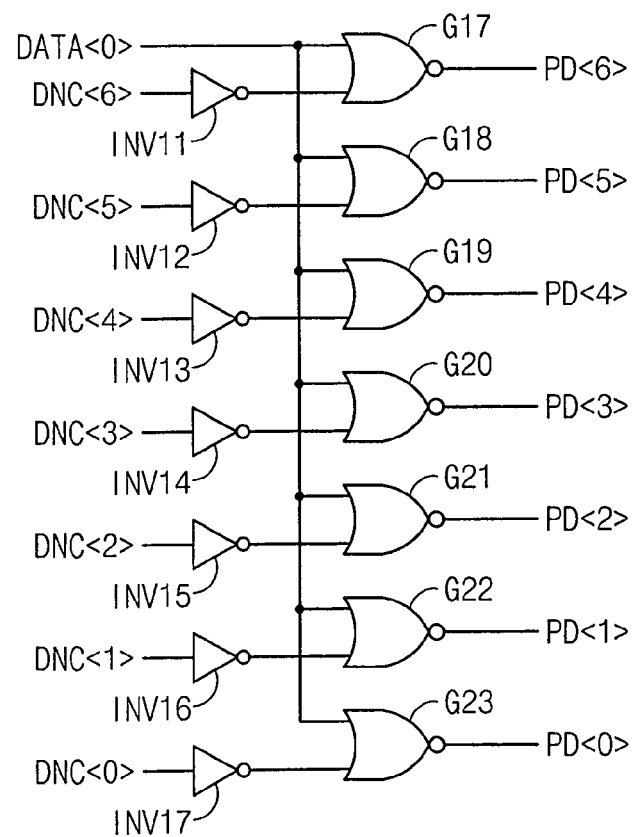

Referring to FIG. 7, the drive controller 260 receives the impedance control codes UPC<6:0> and DNC<6:0> from the selector 340 and a data bit DATA<0> of DATA_OUT from the sense amplifier circuit 250, and then generates pull-up and pull-down control signals PU<6:0> and PD<6:0>. The drive controller 260 is constructed with seven NADN gates G10~G16, seven NOR gates G17~G23, and seven inverters INV11~INV17. The NAND gates G10~G16 each inputs the impedance control codes UPC<6:0> and outputs the pull-up control signals PU<6:0>, being controlled by DATA<0>. The NOR gates G17~G23 each inputs the impedance control codes DNC<6:0> through the inverters INV11~INV17 and outputs the pull-down control signals PD<6:0>, being controlled by DATA<0>.

When DATA<0> provided from the sense amplifier circuit 250 is "1" (binary code), the pull-up control signals PU<6:0> are dependent on the variable impedance control codes UPC<6:0>. For instance, assuming that UPC<6:0> is "1010101", PU<6>, PU<4>, PU<2>, and PU<0> are set on low levels while PU<5>, PU<3>, and PU<1> are set on high levels. During this, as outputs of the NOR gates G17~G23, i.e., PD<6:0>, are maintained on low levels regardless of the states of their inputs DNC<6:0> because DATA<0> is being on "1".

On the other hand, when DATA<0> provided from the sense amplifier circuit 250 is "0", the pull-up control signals PD<6:0> are dependent on the variable impedance control codes DNC<6:0>. For instance, assuming that DNC<6:0> is "1010101", PD<6>, PD<4>, PD<2>, and PD<0> are set on low levels while PD<5>, PD<3>, and PD<1> are set on high levels. During this, as the outputs of the NAND gates G10~G16, i.e., PU<6:0>, are maintained on low levels regardless of the states of theirs inputs UPC<6:0> because DATA<0> is being "0".

According as aforementioned, the pull-up control signals PU<6:0> are selectively enabled in accordance with the variable impedance control codes UPC<6:0> when the data bit DATA<0> provided from the sense amplifier circuit 250 is in the state of "1", while the pull-down control signals PD<6:0> are selectively enabled in accordance with the variable impedance control code DNC<6:0> when the data bit DATA<0> is in the state of "1". The pull-up and pull-down control signals, UPC<6:0> and DNC<6:0>, are exclusive from each other.

Figure 8:
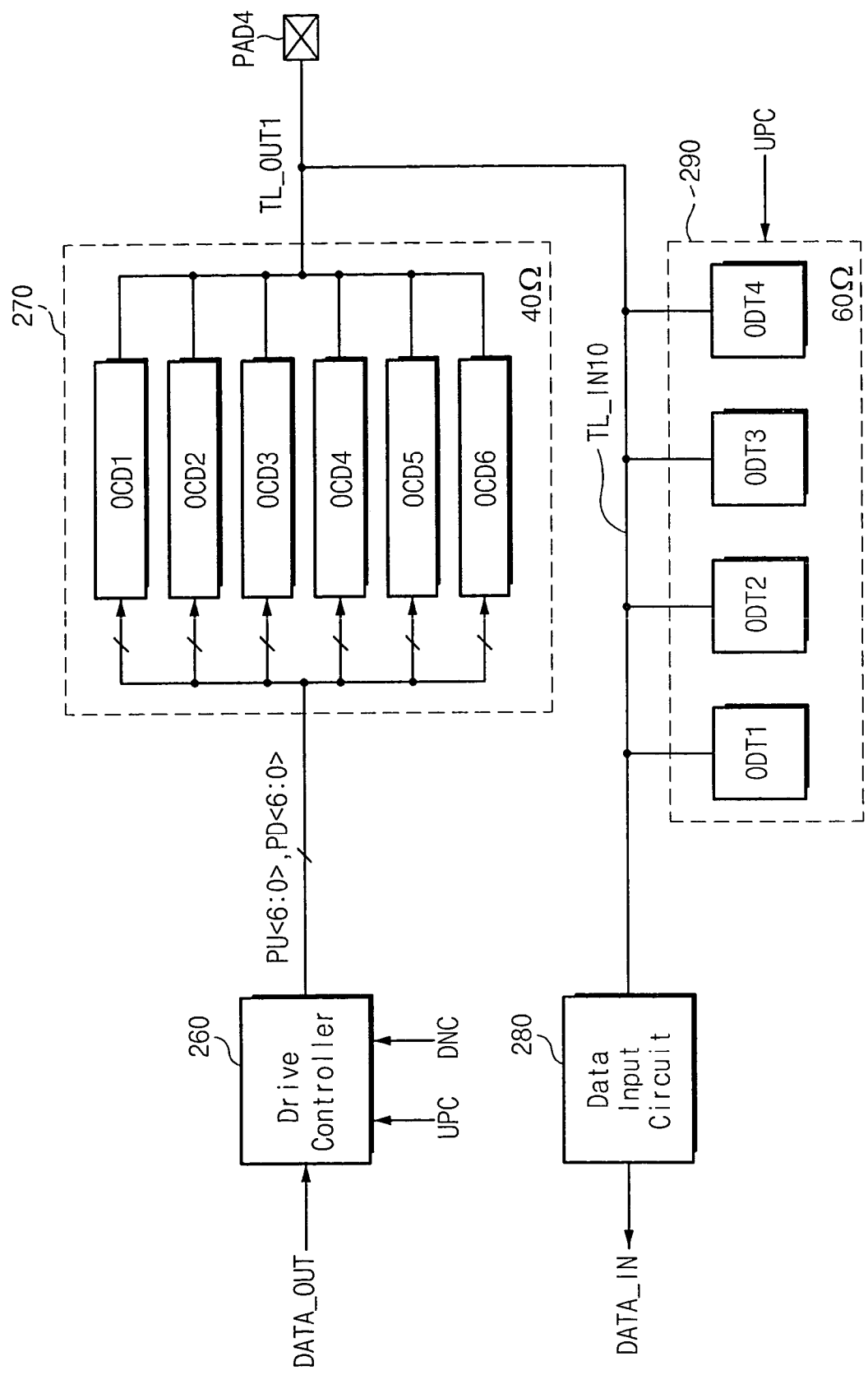
FIG. 8 is a block diagram of an off-chip driver and termination circuit shown in FIG. 2.

FIG. 8 is a block diagram illustrating the off-chip driver 270 and the termination circuit 290 shown in FIG. 2. Although FIG. 8 depicts structural features associated just with a single pad (e.g., PAD 4), the other pads PAD5~PAD6 are also cooperatively arranged each with the construction shown in FIG. 8.

Figure 9:
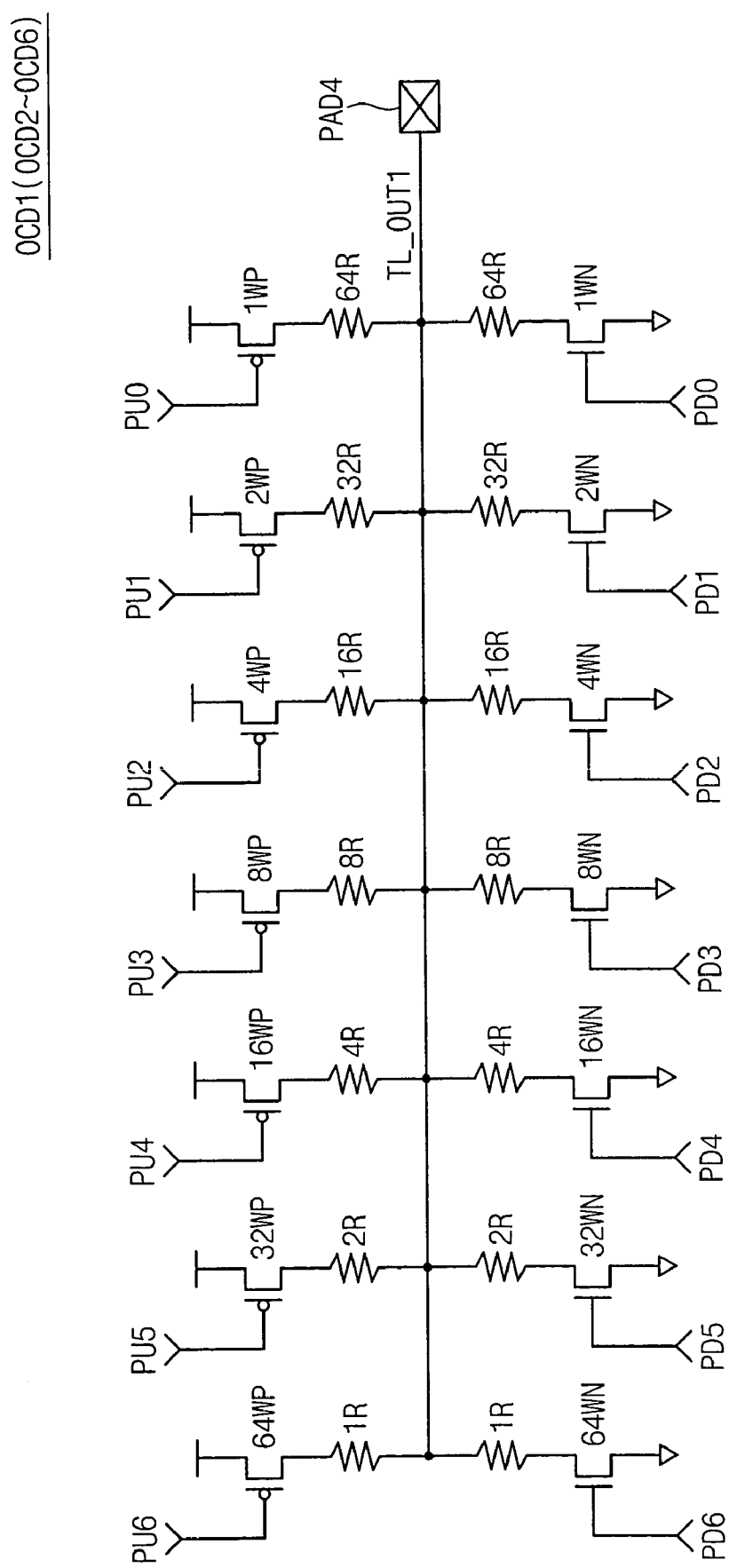
FIG. 9 illustrates an exemplary circuit of the off-chip driver shown in FIG. 8.

Referring to FIG. 8, the off-chip driver 270 is comprised of a plurality of, e.g., six off-chip driving blocks OCD1~OCD6. The off-chip driving blocks OCD1~OCD6 respectively activate the pad PAD4 (or the output signal transfer line TL_OUT1) in response to the pull-up and pull-down control signals, PU<6:0> and PD<6:0>, generated from the drive controller 260. Each off-chip driving block is formed of binary-weighted transistors and binary-weighted resistors as shown in FIG. 9.

It has been described that in the variable impedance code generator 310, the variable impedance circuit 315 has the impedance identical to that of the external reference resistor REXT when a voltage of the pad PAD7 equals to the reference voltage VREF. Also, as the pull-up and pull-down control signals, PU<6:0> and PD<6:0>, are selectively active in accordance with the variable impedance control codes, the off-chip driving blocks OCD1~OCD6 has the impedance identical to the external reference resistor REXT. For example, if the external reference resistor REXT is 240Ω, the off-chip driving blocks OCD1~OCD6 have the impedance of 240Ω in accordance with the impedance control codes. As the six off-chip driving blocks OCD1~OCD6 are connected to each pad in parallel, each pad (or each output signal transfer line is driven by the off-chip driver with the impedance of 40Ω.

Figure 10:
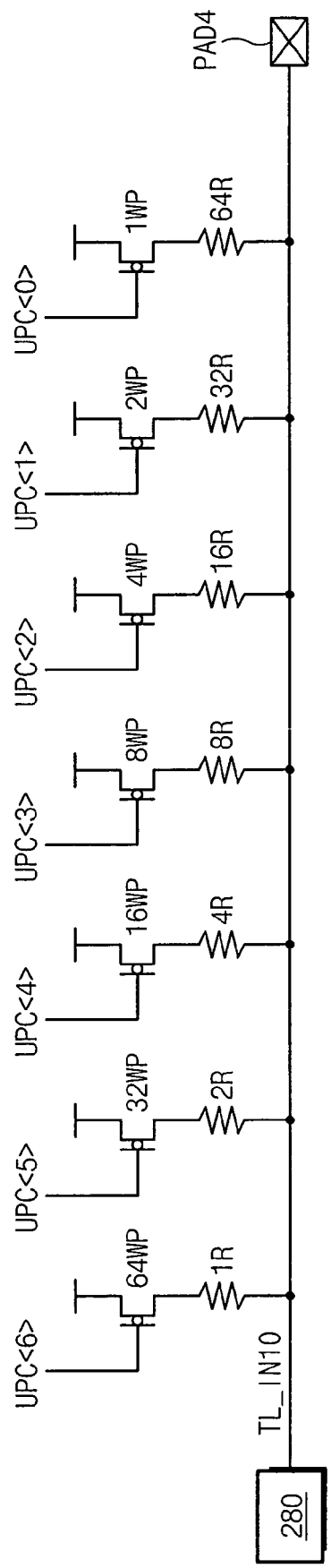
FIG. 10 illustrates an exemplary circuit of the termination circuit shown in FIG. 8.

In FIG. 8, the termination circuit 290 is comprised of four termination blocks ODT1~ODT4 connected in parallel to the pad PAD4 or the input signal transfer line TL_IN10. Each termination block terminates the input signal transfer line TL_IN10 in response to the impedance control code UPC assigned thereto. Each termination block is formed of binary-weighted transistors and binary-weighted resistors as shown in FIG. 10. As described before, in the variable impedance code generator 310, the variable impedance circuit 315 has the impedance identical to that of the external reference resistor REXT when a voltage of the pad PAD7 equals to the reference voltage VREF. Also, as the impedance control code UPC<6:0> are identical to the variable impedance control codes, the termination blocks ODT1~ODT6 have the impedance each identical to the external reference resistor REXT. For example, if the external reference resistor REXT is 240Ω, the off-chip driving blocks OCD1~OCD6 have the impedance of 240Ω in accordance with the impedance control codes. As the four termination blocks ODT1~ODT6 are connected to each pad in parallel, each pad (or each output signal transfer line is driven by the termination circuit 290 with the impedance of 60Ω.

Figure 11:
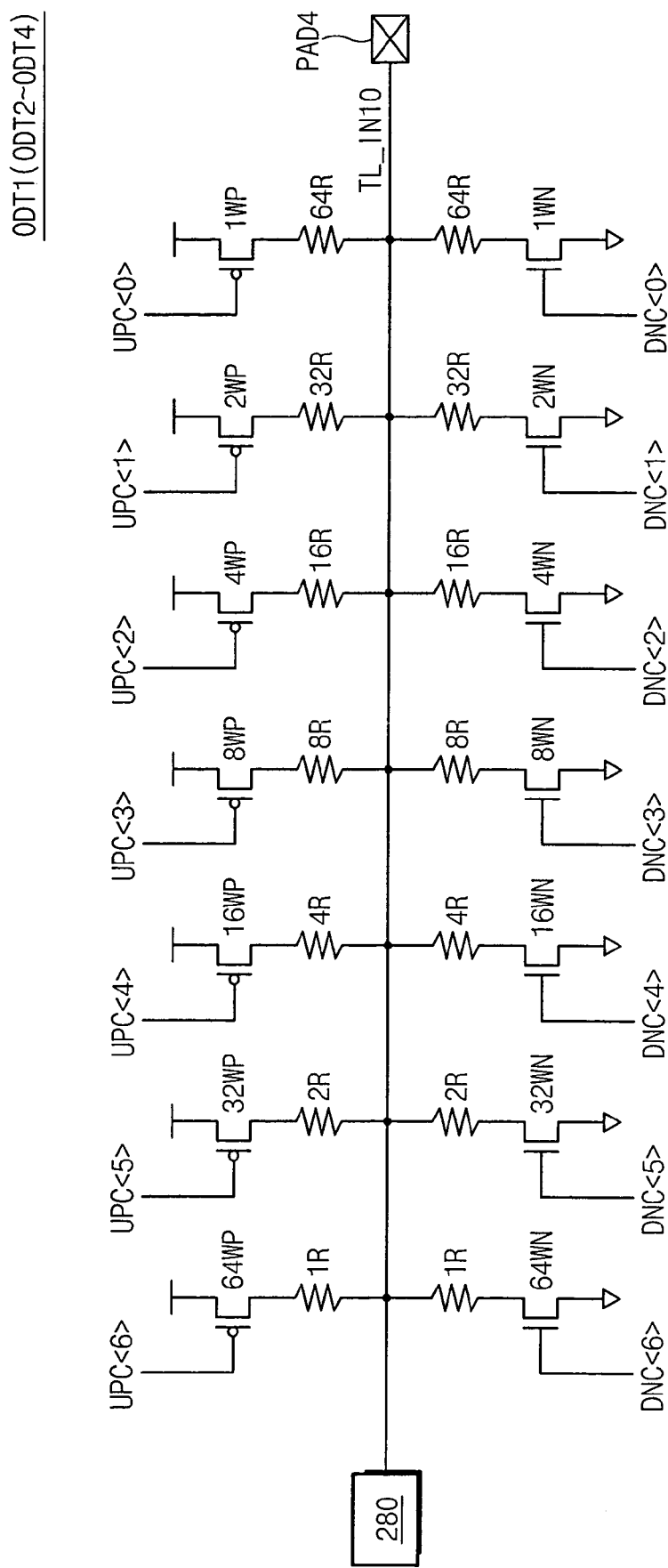
FIG. 11 illustrates another circuit of the termination circuit shown in FIG. 8.

In FIG. 8, while the termination circuit 290 is configured to be controlled by the impedance control codes UPC generated from selector 340 of FIG. 2, it may be arranged to be operable with the whole of the impedance control codes UPC<6:0> and DNC<6:0>. The other termination circuit 300 associated with the input signal transfer lines TL-IN11 TL_IN31 are constructed in the same structures shown in FIGS. 8, 10 and 11, although not illustrated.

The operations for adjusting the impedance of the termination circuit and off-chip driver will be described hereinafter in conjunction with the relevant drawings.

The program register 330 is set to be programmable for selecting the fixed impedance control codes UPCF<6:0> and DNCF<6:0> and the variable impedance control codes UPCV<6:0> and DNCV<6:0>. In this embodiment, the program register 330 is programmed to select the variable impedance control codes UPCV<6:0> and DNCV<6:0>. The program register 330 generates a code selection signal SEL of a low level to cause the selector 340 to select the output of the variable impedance generator 310. The variable impedance code generator 310 outputs the variable impedance control codes UPCV<6:0> and DNCV<6:0> oriented to the impedance of the external reference resistor REXT connected to the pad PAD7. The variable impedance control codes are transferred to the termination circuits 290 and 300 and the drive controller 260. The termination circuit 340 may be associated with the impedance control codes UPC<6:0> or both UPC<6:0> and DNC<6:0>.

The termination circuit 300 terminates the input signal transfer lines TL_IN11~TL_IN31 in response to the impedance control code UPC<6:0>. The termination circuit 290 terminates the input signal transfer lines TL_IN10~TL_IN31 in response to the impedance control code UPC<6:0> during a write operation. The termination circuits 290 and 300 have the same impedance as such 60Ω when the external reference resistor REXT of 240Ω is connected to the pad PAD7. This is because the four termination blocks ODT1~ODT4 of each termination circuit are connected to their corresponding pad (or input signal transfer line) in parallel and controlled by the same impedance control code for the concordance of impedance (e.g., 240Ω) with the external reference resistor REXT.

At the same time, the impedance control code UPC<6:0> or DNC<6:0> selected by the selector 340 are transferred to the drive controller 260. The drive controller 260 generates the pull-up control signal PU<6:0> or the pull-down control signal PD<6:0> in accordance with the data DATA_OUT (i.e., DATA<0>) provided from the sense amplifier circuit 250. The pull-up control signal PU<6:0> or the pull-down control signal PD<6:0> is identical to the impedance control code UPC<6:0> or DNC<6:0>. When the external reference resistor REXT of 240Ω is connected to the pad PAD7, the off-chip driver 270 has 40Ω in impedance. This is because the six off-chip driving blocks OCD1~OCD6 of each off-chip driver are connected to their corresponding pad (or input signal transfer line) in parallel and controlled by the same pull-up and pull-down control signals for the concordance of impedance (e.g., 240Ω) with the external reference resistor REXT.

In a read operation, the termination circuit 300 and the off-chip driver 270 are controlled contemporaneously by the impedance control codes UPC<6:0> and DNC<6:0> selected for equalizing the impedance required. As similar, in a write operation, the termination circuits 290 and 300 are controlled by the impedance control codes UPC<6:0> and DNC<6:0> to have the required impedance. In other words, the impedance control codes UPC<6:0> and DNC<6:0> adjust the impedance of the termination circuits 290 and 300, as well as control the impedance of the off-chip driver 270. Therefore, it is possible to adjust the impedance of the termination circuits 290 and 300 and the off-chip driver 270 at one time by means of a single external reference resistor (e.g., REXT) and impedance code generator (e.g., 310 or 320).

Figure 12:
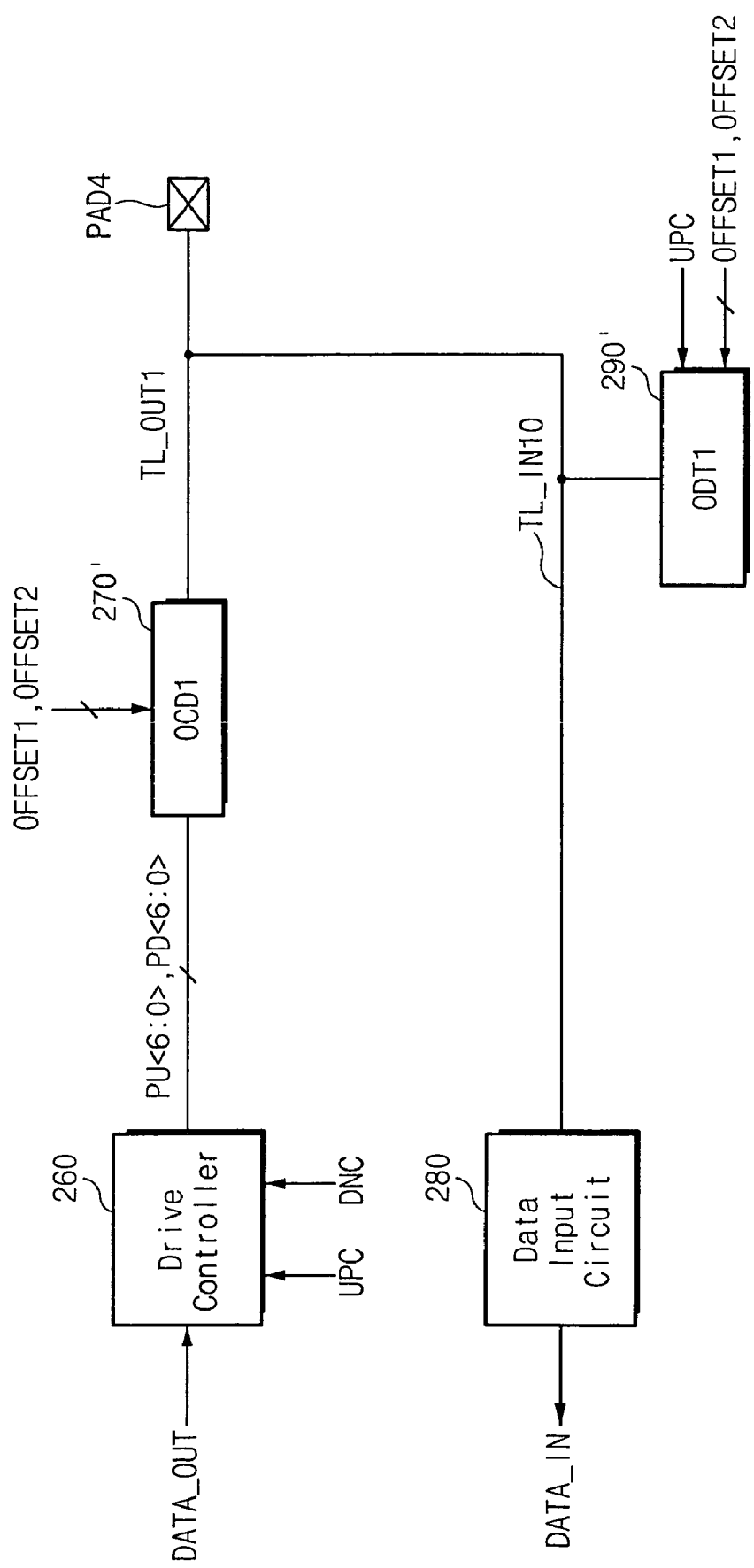
FIG. 12 is a diagram illustrating another embodiment of the off-chip driver and termination circuit shown FIG. 2.

FIG. 12 is a diagram illustrating another embodiment of the off-chip driver and termination circuit shown FIG. 2.

Figure 13:
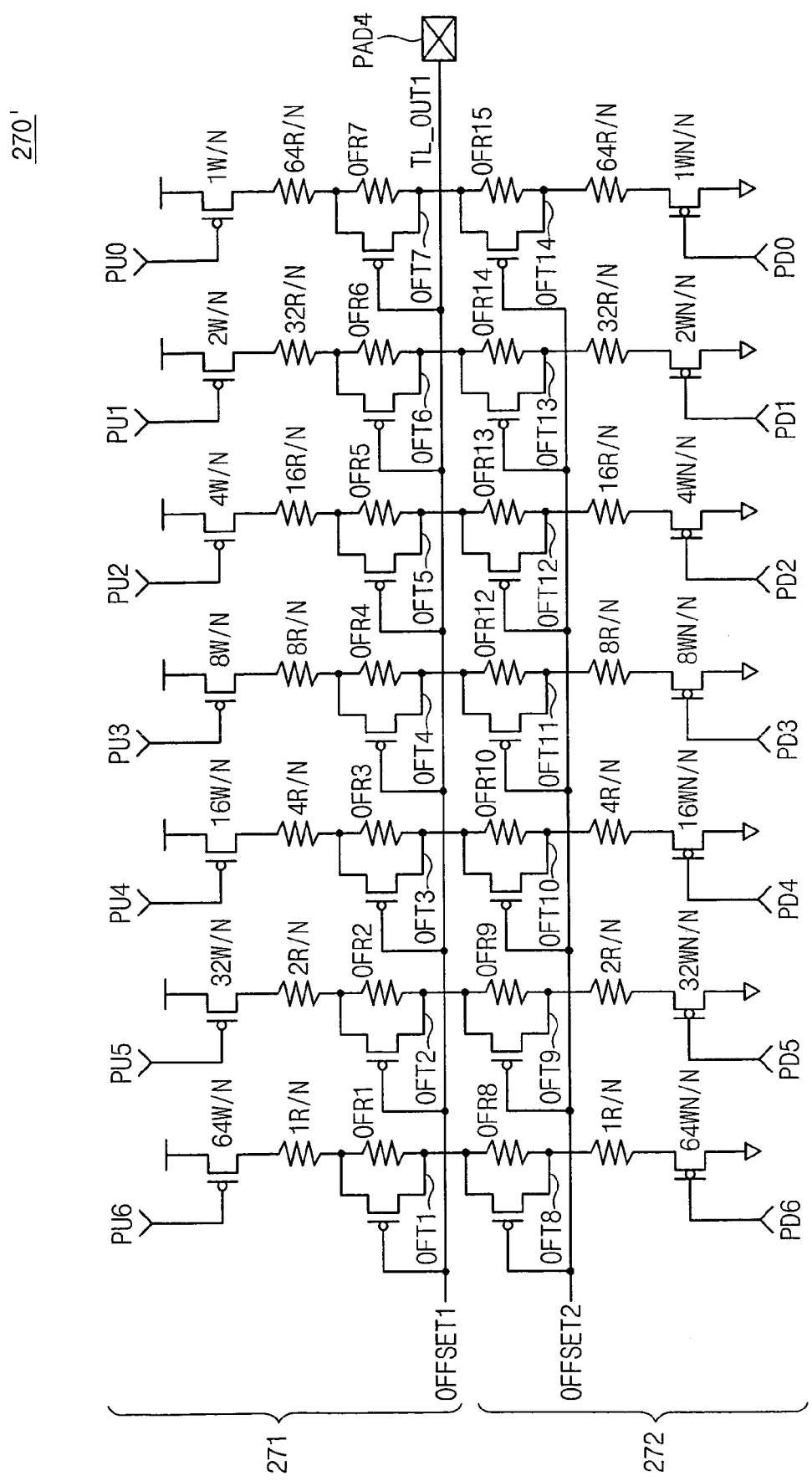
FIG. 13 illustrates an exemplary circuit of the off-chip driver shown in FIG. 12.

Different from the feature of FIG. 8, the off-chip driver 270' is configured with a single off-chip driving block OCD1, the impedance of which is minutely adjustable in accordance with offset selection signals OFFSET0 and OFFSET1. Referring to FIG. 13, the off-chip driver 270' is composed of pull-up and pull-down sections 271 and 272. The pull-up section 271 is formed of binary-weighted transistors 64WP/N~1WP/N and binary-weighted resistors 1R/N~54R/N. For the purpose of implementing the off-chip driver 270' with the impedance of 40Ω, the binary-weighted transistors and resistors, 64WP/N~1WP/NT and 1R/N~64R/N, are designed with being linearly shrunk down by 1/N from the transistors and resistors shown in FIGS. 9, 10, or 11. The binary-weighted transistors 64WP/N~1WP/N are controlled by the pull-up control signals PU<6:0> and thereby the pad PAD4 is driven by way of the off-chip driver 270' having the impedance of 40Ω.

The pull-up section 271 further includes offset resistors OFR1~OFR7 and offset transistors OFT1~OFT7. The offset transistors OFT1~OFT7 are controlled contemporaneously by the offset selection signal OFFSET1. The impedance of the pull-up section 271 may be adjusted in accordance with an activation of the offset selection signal OFFSET1. The offset transistors OFT1~OFT7 may be constructed in the same transistor dimension or the binary-weighted arrangement. Also, the offset resistors OFR1~OFR7 may be constructed in the same transistor dimension or the binary-weighted arrangement.

The pull-down section 272 is formed of binary-weighted transistors 64WN/N~1WN/N and binary-weighted resistors 1R/N~54R/N. For the purpose of implementing the off-chip driver 270' with the impedance of 60Ω, the binary-weighted transistors and resistors, 64WN/N~1WN/N and 1R/N~64R/N, are designed with being linearly shrunk down by 1/N from the transistors and resistors shown in FIGS. 9, 10, or 11. The binary-weighted transistors 64WN/N~1WN/N are controlled by the pull-down control signals PD<6:0> and thereby the pad PAD4 is driven by way of the off-chip driver 270' having the impedance of 60Ω.

The pull-down section 272 further includes offset resistors OFR8~OFR14 and offset transistors OFT8~OFT14. The offset transistors OFT8~OFT14 are controlled contemporaneously by the offset selection signal OFFSET2. The impedance of the pull-up section 272 may be adjusted in accordance with an activation of the offset selection signal OFFSET2. The offset transistors OFT8~OFT14 may be constructed in the same transistor dimension or the binary-weighted arrangement. Also, the offset resistors OFR8~OFR14 may be constructed in the same transistor dimension or in the binary-weighted arrangement.

Figure 14:
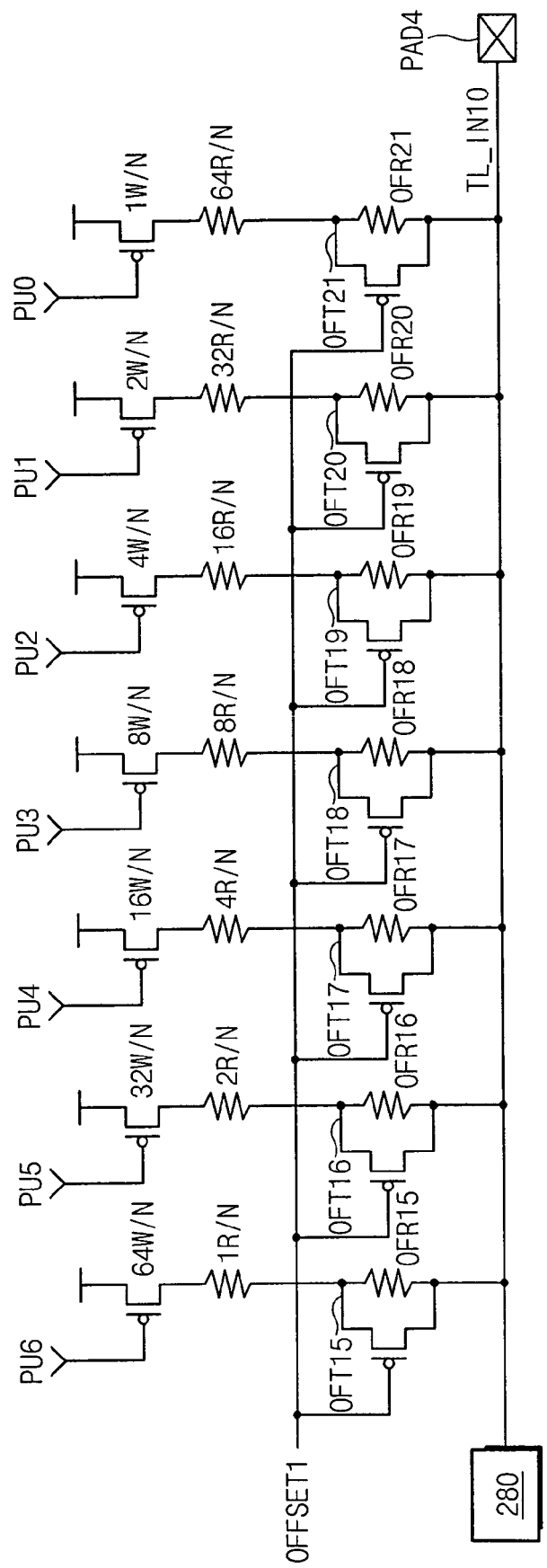
FIG. 14 illustrates an exemplary circuit of the termination circuit shown in FIG. 12.

Returning to FIG. 12, a termination circuit 290' is different from that of FIG. 8 in employing a single termination block ODT1. The impedance of the termination circuit 290' is minutely adjusted in accordance with the offset selection signals OFFSET1 and OFFSET2. Referring to FIG. 14, the termination circuit 290' is comprised of binary-weighted transistors 64WN/N~1WN/N and binary-weighted resistors 1R/N~54R/N. For the purpose of implementing the termination circuit 290' with the impedance of 40Ω, the binary-weighted transistors and resistors, 64WN/N~1WN/N and 1R/N~64R/N, are designed with being linearly shrunk down by 1/N from the transistors and resistors shown in FIGS. 9, 10, or 11. The binary-weighted transistors 64WN/N~WN/N are controlled by the pull-up control signals PU<6.0> and thereby the input signal transfer line TL_IN10 is terminated by way of the termination circuit 290' having the impedance of 40Ω.

The termination circuit 290' further includes offset resistors OFR15~OFR21 and offset transistors OFT15~OFT21. The offset transistors OFT15~OFT21 are controlled contemporaneously by the offset selection signal OFFSET1. The impedance of the termination circuit 290' may be adjusted in accordance with an activation of the offset selection signal OFFSET1. The offset transistors OFT15~OFT21 may be constructed in the same transistor dimension or the binary-weighted arrangement. Also, the offset resistors OFR15~OFR21 may be constructed in the same transistor dimension or in the binary-weighted arrangement.

Even not illustrated, the termination circuit 300 shown in FIG. 2 may be formed with the same circuit pattern as shown in FIG. 14.

According as the present invention as described above, it is possible to prpperly adjust the impedance of the termination circuit and the off-chip driver by means of a single external reference resistor and impedance code generator.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

While the invention has been disclosed in its preferred embodiments, the specific embodiments as disclosed and illustrated herein are not to be considered in a limiting sense. Indeed, it should be readily apparent to those skilled in the art in view of the present description that the invention may be modified in numerous ways. The inventor regards the subject matter of the invention to include all combinations and sub-combinations of the various elements, features, functions and/or properties disclosed herein.

The following claims define certain combinations and sub-combinations, which are regarded as novel and non-obvious. Additional claims for other combinations and sub-combinations of features, functions, elements and/or properties may be presented in this or a related document.

I claim:

1. A semiconductor integrated circuit device comprising:
an impedance controller for generating impedance control codes variable in accordance with an impedance of an external reference resistor;
an input circuit for transferring an input signal to an internal circuit, the input signal being supplied through an input signal transfer line;
a termination circuit for terminating the input signal transfer line in response to at least one of the impedance control codes; and
an output circuit for driving an output signal transfer line in accordance with a signal output from the internal circuit, having an impedance variable in accordance with the impedance control codes.

2. The device of claim 1, wherein the termination circuit comprises a multiplicity of termination blocks connected in parallel to the input signal transfer line, each termination block being controlled by one of the impedance control codes.

3. The device of claim 1, wherein the termination circuit comprises a multiplicity of termination blocks connected in parallel to the input signal transfer line, each termination block being controlled by the impedance control codes.

4. The device of claim 1, wherein the output circuit comprises a multiplicity of drivers connected in parallel to the output signal transfer line, each driver having an impedance adjustable by the impedance control codes.

5. The device of claim 1, wherein the impedance controller comprises:
a pad connected to the external reference resistor;
a first variable impedance circuit connected to the pad, being controlled by a first impedance control code among the impedance control codes for impedance match with the external reference resistor;
a first comparator for comparing a voltage of the pad with a reference voltage;
a first up/down counter for generating the first impedance control code in response to an output of the first comparator;
a second variable impedance circuit connected to an internal node, being controlled by the first impedance control code among the impedance control codes for impedance match with the external reference resistor;
a third variable impedance circuit connected to the internal node, being controlled by a second impedance control code among the impedance control codes for impedance match with the external reference resistor;
a second comparator for comparing a voltage of the internal node with the voltage of the pad; and
a second up/down counter for generating the second impedance control code in response to an output of the second comparator.

6. The device of claim 5, wherein each of the first through variable impedance circuits comprises binary-weighted transistors and binary-weighted resistors.

7. The device of claim 6, wherein the termination circuit comprises binary-weighted transistors and binary-weighted resistors which are configured with linearly shrunk down from the binary-weighted transistors and resistors belonging to the first through third variable impedance circuits.

8. The device of claim 1, wherein the impedance controller generates the impedance control codes constant regardless of an impedance of the external reference resistor, in response to a selection signal.

9. The device of claim 6, wherein the output circuit comprises binary-weighted transistors and binary-weighted resistors which are configured with linearly shrunk down from the binary-weighted transistors and resistors belonging to the first through third variable impedance circuits.

10. A semiconductor memory device comprising:
an array of memory cells arranged in rows and columns;
a sense amplifier circuit for reading/writing data from/in the memory cells;
a first code generator for generating fixed impedance control codes;
a second code generator for generating variable impedance control codes dependent on an impedance of the external reference resistor;
a selector for selecting the fixed impedance control codes or the variable impedance control codes in response to a code selection signal;
a drive controller for generating pull-up and pull-down control signals in response to data output from the sense amplifier circuit and the fixed or variable impedance control codes selected by the selector;
an off-chip driver for driving data transfer lines in response to the pull-up and pull-down control signals during a read operation, having an impedance variable in accordance with the pull-up and pull-down control signals; and
a first termination circuit for terminating the data transfer lines in response to at least the alternative of the fixed and variable impedance control codes selected by the selector during a write operation.

11. The device of claim 10 which further comprises:
a data input circuit for transferring data to the sense amplifier circuit from the data transfer lines during the write operation.

12. The device of claim 10, wherein the first termination circuit comprises a multiplicity of termination blocks connected in parallel to the data transfer line, each termination block being controlled by the alternative of the fixed and variable impedance control codes selected by the selector.

13. The device of claim 10, wherein the first termination circuit comprises a multiplicity of termination blocks connected in parallel to the data transfer line, each termination block being controlled by the fixed or variable impedance control codes.

14. The device of claim 10, wherein the off-chip driver comprises a multiplicity of driving blocks connected in parallel to the data transfer lines, each driving block having an impedance adjustable by the pull-up and pull-down control signals.

15. The device of claim 10 which further comprises:
an input buffer for receiving address and control signals input through input transfer lines;
a row decoder for selecting the row in response to a row address output from the input buffer;
a column decoder for selecting the column in response to a column address output from the input buffer; and a second termination circuit for terminating the input transfer lines in response to at least the alternative of the fixed and variable impedance control codes selected by the selector.

16. The device of claim 15, wherein the second termination circuit comprises a multiplicity of termination blocks connected in parallel to the data transfer line, each termination block being controlled by the alternative of the fixed and variable impedance control codes selected by the selector.

17. The device of claim 15, wherein the second termination circuit comprises a multiplicity of termination blocks connected in parallel to the data transfer line, each termination block being controlled by the fixed or variable impedance control codes.

18. The device of claim 15, wherein the second code generator comprises:
a pad connected to the external reference resistor;
a first variable impedance circuit connected to the pad, being controlled by a first impedance control code among the impedance control codes for impedance match with the external reference resistor;
a first comparator for comparing a voltage of the pad with a reference voltage;
a first up/down counter for generating the first impedance control code in response to an output of the first comparator;
a second variable impedance circuit connected to an internal node, being controlled by the first impedance control code among the impedance control codes for impedance match with the external reference resistor;
a third variable impedance circuit connected to the internal node, being controlled by a second impedance control code among the impedance control codes for impedance match with the external reference resistor;
a second comparator for comparing a voltage of the internal node with the voltage of the pad; and
a second up/down counter for generating the second impedance control code in response to an output of the second comparator.

19. The device of claim 18, wherein each of the first through variable impedance circuits comprises binary-weighted transistors and binary-weighted resistors.

20. The device of claim 19, wherein the first termination circuit comprises binary-weighted transistors and binary-weighted resistors which are configured with linearly shrunk down from the binary-weighted transistors and resistors belonging to the first through third variable impedance circuits.

21. The device of claim 19, wherein the second termination circuit comprises binary-weighted transistors and binary-weighted resistors which are configured with linearly shrunk down from the binary-weighted transistors and resistors belonging to the first through third variable impedance circuits.

22. The device of claim 15 which further comprises a selection signal generator for generating an offset selection signal and the code selection signal in response to control signals.

23. The device of claim 22, wherein impedances of the off-chip driver and the first and second termination circuits are variable in accordance with the offset selection signal.

24. The device of claim 22, wherein the selection signal generator is configured with a mode register set.

25. A semiconductor integrated circuit device comprising:
an input circuit for transferring an external signal from an input signal transfer line to an internal circuit;
an impedance controller for generating impedance control codes variable in accordance with an external reference resistor, including binary-weighted transistors and binary-weighted resistors;
a termination circuit for terminating the input signal transfer line in response to at least one of the impedance control codes, including binary-weighted transistors and binary-weighted resistors; and
an output circuit for driving an output signal transfer line in accordance with a signal output from the internal circuit, including binary-weighted transistors and binary-weighted resistors and having an impedance variable in accordance with the impedance control codes;
wherein the binary-weighted transistors and resistors, of the termination circuit and the output circuit, are configured with linearly shrunk down from the binary-weighted transistors and resistors of the impedance controller.

26. A semiconductor memory device comprising:
an array of memory cells arranged in rows and columns;
a sense amplifier circuit for reading/writing data from/in the memory cells;
a first code generator for generating fixed impedance control codes;
a second code generator for generating variable impedance control codes dependent on an impedance of the external reference resistor, including binary-weighted transistors and binary-weighted resistors;
a selector for selecting the fixed impedance control codes or the variable impedance control codes in response to a code selection signal;
a drive controller for generating pull-up and pull-down control signals in response to data output from the sense amplifier circuit and the fixed or variable impedance control codes selected by the selector;
an off-chip driver for driving data transfer lines in response to the pull-up and pull-down control signals during a read operation, having an impedance variable in accordance with the pull-up and pull-down control signals and including binary-weighted transistors and binary-weighted resistors; and
a first termination circuit for terminating the data transfer lines in response to at least the alternative of the fixed and variable impedance control codes selected by the selector during a write operation, including binary-weighted transistors and binary-weighted resistors;
wherein the binary-weighted transistors and resistors, of the first termination circuit and the off-chip driver, are configured with linearly shrunk down from the binary-weighted transistors and resistors of the second code generator.

27. The device of claim 26 which further comprises:
an input buffer for receiving address and control signals input through input transfer lines;
a row decoder for selecting the row in response to a row address output from the input buffer;
a column decoder for selecting the column in response to a column address output from the input buffer; and
a second termination circuit for terminating the input transfer lines in response to at least the alternative of the fixed and variable impedance control codes selected by the selector, including binary-weighted transistors and binary-weighted resistors.

28. The device of claim 27, wherein the binary-weighted transistors and binary-weighted resistors of the second termination circuit are configured with linearly shrunk down from the binary-weighted transistors and resistors belonging to the second code generator.

29. A semiconductor memory device comprising:
- an array of memory cells arranged in rows and columns;
- a sense amplifier circuit for reading/writing data from/in the memory cells;
- a code generator for generating impedance control codes variable in accordance with an impedance of the external reference resistor;
- a drive controller for generating pull-up and pull-down control signals in response to data output from the sense amplifier circuit and the impedance control codes selected by the selector;
- an off-chip driver for driving data transfer lines in response to the pull-up and pull-down control signals during a read operation, having an impedance variable in accordance with the pull-up and pull-down control signals; and
- a first termination circuit for terminating the data transfer lines in response to at least one of the impedance control codes during a write operation.

30. The device of claim 29 which further comprises:
- a data input circuit for transferring data to the sense amplifier circuit firm the data transfer lines during the write operation.

31. The device of claim 29, wherein the first termination circuit comprises a multiplicity of termination blocks connected in parallel to the data transfer line, each termination block being controlled by one of the impedance control codes selected by the selector.

32. The device of claim 29, wherein the first termination circuit comprises a multiplicity of termination blocks connected in parallel to the data transfer line, each termination block being controlled by the impedance control codes.

33. The device of claim 29, wherein the off-chip driver comprises a multiplicity of driving bocks connected in parallel to the data transfer lines, each driving block having an impedance adjustable by the pull-up and pull-down control signals.

34. The device of claim 29 which further comprises:
- an input buffer for receiving address and control signals input through input transfer lines;
- a row decoder for selecting the row in response to a row address output from the input buffer;
- a column decoder for selecting the column in response to a column address output from the input buffer; and
- a second termination circuit for terminating the input transfer lines in response to at least one of the impedance control codes selected by the selector.

35. The device of claim 34, wherein the second termination circuit comprises a multiplicity of termination blocks connected in parallel to the data transfer line, each termination block being controlled by one of the impedance control codes.

36. The device of claim 34, wherein the second termination circuit comprises a multiplicity of termination blocks connected in parallel to the data transfer line, each termination block being controlled by the impedance control codes.

* * * * *